United States Patent
Wodnicki et al.

(10) Patent No.: US 8,649,185 B2
(45) Date of Patent: Feb. 11, 2014

(54) ELASTIC CONFORMAL TRANSDUCER APPARATUS

(75) Inventors: Robert Gideon Wodnicki, Niskayuna, NY (US); Kaustubh Ravindra Nagarkar, Clifton Park, NY (US); William Hullinger Huber, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 281 days.

(21) Appl. No.: 13/282,949

(22) Filed: Oct. 27, 2011

(65) Prior Publication Data

US 2013/0107487 A1    May 2, 2013

(51) Int. Cl.
*H05K 1/11* (2006.01)

(52) U.S. Cl.
USPC ........... 361/784; 361/760; 361/807; 361/729; 174/260

(58) Field of Classification Search
USPC ................ 361/729, 760, 784, 807, 809, 810; 174/260
See application file for complete search history.

(56) References Cited

U.S. PATENT DOCUMENTS

| | | | |
|---|---|---|---|
| 2006/0094965 A1 | 5/2006 | Voss et al. | |
| 2008/0146943 A1 | 6/2008 | Jenkins et al. | |
| 2008/0228077 A1* | 9/2008 | Wilk et al. | 600/447 |
| 2009/0024009 A1 | 1/2009 | Freeman et al. | |
| 2009/0160289 A1* | 6/2009 | Wilser et al. | 310/300 |
| 2009/0163807 A1 | 6/2009 | Sliwa | |
| 2009/0281421 A1* | 11/2009 | Culp et al. | 600/426 |
| 2010/0236330 A1 | 9/2010 | Nyholt et al. | |
| 2010/0302753 A1* | 12/2010 | Cleveland | 361/807 |
| 2011/0072970 A1 | 3/2011 | Slobodzian et al. | |
| 2011/0082412 A1 | 4/2011 | Hyde et al. | |
| 2011/0112405 A1 | 5/2011 | Barthe et al. | |
| 2012/0179044 A1* | 7/2012 | Chiang et al. | 600/447 |
| 2013/0021758 A1* | 1/2013 | Bernstein et al. | 361/728 |

FOREIGN PATENT DOCUMENTS

| | | |
|---|---|---|
| WO | 2008136030 A1 | 11/2008 |
| WO | 2008137030 A1 | 11/2008 |
| WO | 2011027093 A1 | 3/2011 |

OTHER PUBLICATIONS

Joel J. Niederhauser et al.; Combined Ultrasound and Optoacoustic System for Real-Time High-Contrast Vascular Imaging in Vivo; IEEE Transactions on Medical Imaging, vol. 24, No. 4, Apr. 2005; pp. 436-440.

* cited by examiner

*Primary Examiner* — Hoa C Nguyen
(74) *Attorney, Agent, or Firm* — Jenifer Haeckl

(57) ABSTRACT

In one embodiment, a transducer apparatus comprises an elastomeric substrate and another elastomeric substrate. A plurality of transducer modules are mounted on the elastomeric substrate. A plurality of additional transducer modules are mounted on the other elastomeric substrate. Each transducer module of the plurality of transducer modules and the plurality of additional transducer modules comprises a transducer array having multiple transducer elements and an electronic circuitry coupled to the transducer array. The plurality of transducer modules and the plurality of additional transducer modules are mounted relative to each other whereby the plurality of additional transducer modules substantially cover any dead zones of the plurality of transducer modules.

26 Claims, 10 Drawing Sheets

ELASTIC CONFORMAL TRANSDUCER APPARATUS

BACKGROUND

Embodiments presented herein relate generally to a field of measurement systems and, more particularly, to an elastic conformal transducer apparatus.

A transducer is a device that converts one form of energy into another form. Examples of transducers include ultrasound transducer, antennas, photodetector, and piezoelectric crystal, among others. In many applications, such as, for example, medical imaging, structural testing, non-destructive testing and multipoint contour monitoring, more than one transducer may be required. In such cases, array of transducers may be used. The array of transducers may be placed on a surface of interest for analysis. The surface of interest may not be uniform or may have arbitrary geometries. Thus, it may be difficult to achieve proper positioning and/or alignment of transducers on the surface. One conventional approach to overcome this challenge uses providing flexible connectors between the transducers in the array. Due to the flexibility of connectors between the transducers in the array, the array of transducers may be aligned to the surface. However, the alignment may cause a non-uniform coverage of the surface, leading to dead zones in transducer coverage. The dead zones may cause a loss of vital observation data. Further, the dead zones may also introduce noise/artifacts. For example, in medical imaging, the dead zones may introduce image artifacts into diagnostic images.

An elastic and flexible transducer apparatus is needed that can conform to an area of interest and avoid dead zones in the transducer coverage.

BRIEF DESCRIPTION

One embodiment of an apparatus of the invention comprises an apparatus comprises an elastomeric substrate and another elastomeric substrate. The apparatus also comprises a plurality of transducer modules mounted on the elastomeric substrate. In addition, the apparatus further comprises a plurality of additional transducer modules mounted on another elastomeric substrate. Each transducer module of the transducer modules and the additional transducer modules comprises a transducer array and an electronic circuitry coupled to the transducer array. The transducer array comprises multiple transducer elements. The transducer modules and the additional transducer modules are mounted relative to each other whereby the additional transducer modules substantially cover dead zones of the transducer modules.

An embodiment of a system of the invention comprises a transducer apparatus and a central processing unit. The transducer apparatus comprises an elastomeric substrate and another elastomeric substrate. In addition, transducer apparatus further comprises a plurality of transducer modules and a plurality of additional transducer modules. The transducer modules are mounted on the elastomeric substrate. The additional transducer modules are mounted on another elastomeric substrate. Each transducer module of the transducer modules and the additional transducer modules comprises a transducer array having multiple transducer elements and an electronic circuitry coupled to the transducer array. The transducer modules and the additional transducer modules are mounted relative to each other whereby the additional transducer modules substantially cover dead zones of the transducer modules. The central processing unit is coupled to at least one transducer module of the transducer modules and the additional transducer modules.

DRAWINGS

These and other features, aspects, and advantages of the present system and techniques will become better understood when the following detailed description is read with reference to the accompanying drawings in which like characters represent like parts throughout the drawings, wherein.

DETAILED DESCRIPTION

Various embodiments of an elastic conformal transducer apparatus (hereinafter "transducer apparatus") are disclosed. The transducer apparatus comprises a plurality of transducer modules. Each transducer module comprises an array of transducers. Examples of the transducers may include, without limitation, ultrasonic transducers, optical transducers, thermal transducers, impedance transducers, leakage current transducers, electromagnetic transducers, X-ray transducers, radio frequency (RF) signal transducers, among others. The transducer apparatus is a flexible and stretchable apparatus that can conform to a given surface. The surface may have contours with geometric regularity or arbitrary geometry. Additionally, the transducer apparatus provides substantial transducer coverage while conforming to the given surface by substantially covering dead zones. By covering the dead zones, accuracy of observations is improved. The transducer apparatus as may be designed in various forms, such as, for example, a strip, a patch, a sheet, a band, a blanket, among others.

The transducer apparatus may be used for various applications. For example, transducer apparatuses with ultrasound transducer may be used for continuous non-invasive blood pressure monitoring in the form of a blood-pressure cuff, bone fracture detection in the arms and legs using ultrasound tomography. The transducer apparatus may also be used in impedance tomography of abdomen, lungs and other organs. In another example, transducer apparatus with leakage or magnetic transducers may be used for crack detection in pipes. In another example, the transducer apparatus with optical sensors may be used, for example, in optical applications to optimally capture optical signals. Other applications of transducer apparatuses are also contemplated herein.

Terms "first elastomeric substrate", "second elastomeric substrate", "third elastomeric substrate", or "fourth elastomeric substrate" may be commonly called as "elastomeric substrate". Similarly, terms "first transducer modules", "second transducer modules", "third transducer modules", and "fourth transducer modules" may be commonly called as "transducer modules". The terms "first", "second", "third" and "fourth" are not to be construed as limitations and are only used herein for the convenience of describing embodiments.

Figure 1:
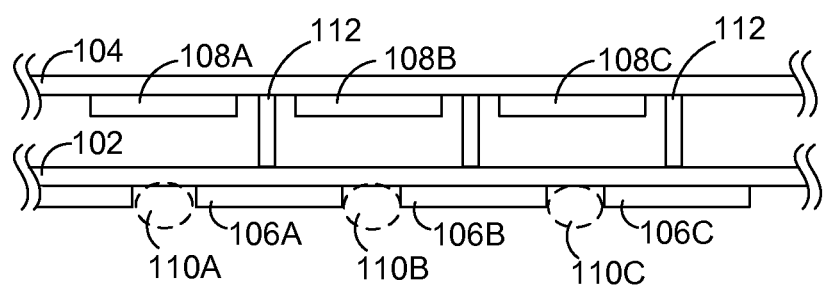
FIG. 1 is a cross sectional view of an exemplary transducer apparatus, according to one embodiment.

FIG. 1 is a cross sectional view of an exemplary transducer apparatus 100, according to one embodiment. The transducer apparatus 100 may comprise at least two elastomeric substrates, for example, a first elastomeric substrate 102, and a second elastomeric substrate 104. The transducer apparatus 100 may further comprise a plurality of first transducer modules 106, such as transducer modules 106A-106C, and a plurality of second transducer modules 108, such as transducer modules 108A-108C.

The plurality of first transducer modules 106 (hereinafter "first transducer modules 106") may be mounted on the first elastomeric substrate 102. The plurality of second transducer modules 108 (hereinafter "second transducer modules 108") may be mounted on the second elastomeric substrate 104. The first transducer modules 106 and the second transducer modules 108 may be mounted on corresponding elastomeric substrates by using one or more methods, such as, for example, flip-chip mounting on pads provided on the elastomeric substrate, adhesive bonding (e.g., using glue, epoxy) and/or wire-bonding to traces on elastomeric substrate. Other known techniques may also be used for mounting the transducer modules on respective elastomeric substrates.

FIG. 1 illustrates an embodiment where the first transducer modules 106 and the second transducer modules 108 are mounted on one surface of the first elastomeric substrate 102 and the second elastomeric substrate 104 respectively. The first transducer modules 106 and the second transducer modules 108 may also be mounted on other surface or on both surfaces of elastomeric substrates. Further, in one example implementation, portions of the elastomeric substrates on which the transducer modules are mounted may be hardened to prevent expansion of corresponding portions. The portion or side of the elastomeric substrate opposite to the side carrying the transducer module may be coated with backing material such as acoustic absorber, x-ray absorber and/or the like, to prevent signal reflections. Also, the portion or side opposite of the elastomeric substrate carrying the transducer module may be covered with stiffener material. The transducer modules may also be coated for providing insulation and/or protection from environment in which they are operated. In one example, the transducer modules may be covered using silicone. Other examples of insulation coating materials include, without limitation, polydimethylsiloxane (PDMS), and transparent epoxy.

The first elastomeric substrate 102 and the second elastomeric substrate 104 are flexible and elastically stretchable substrates. Each of the first elastomeric substrate 102 and the second elastomeric substrate 104 may comprise any suitable elastic material including, but not limited to, nylon, wool, neoprene, cotton, and polyimide. The second elastomeric substrate 104 may be coupled to the first elastomeric substrate 102. According to one example illustrated in FIG. 1, the first elastomeric substrate 102 and the second elastomeric substrate 104 are coupled using rivets 112. Other techniques of coupling, for example, using adhesives, metal connections, solder, heated/melted weld coupling, and thread coupling, may also be used.

The first transducer modules 106 and the second transducer modules 108 are mounted relative to each other such that the second transducer modules 108 substantially cover dead zones 110 of the first transducer modules 106, for example, dead zones 110A, and 110B, as illustrated in FIG. 1. Dead zones may refer to gaps in transducer coverage through which some signals of interest are lost. For example, in case of ultrasonic transducers, dead zones refer to gaps in ultrasonic transducer coverage through which some ultrasonic signals are lost. In another example where optical transducers are used, dead zones refer to gaps in optical transducers coverage through which some optical signals are lost. Coverage of dead zones herein refers to placement of transducers around dead zones to capture signals that pass through dead zones.

Figure 2:
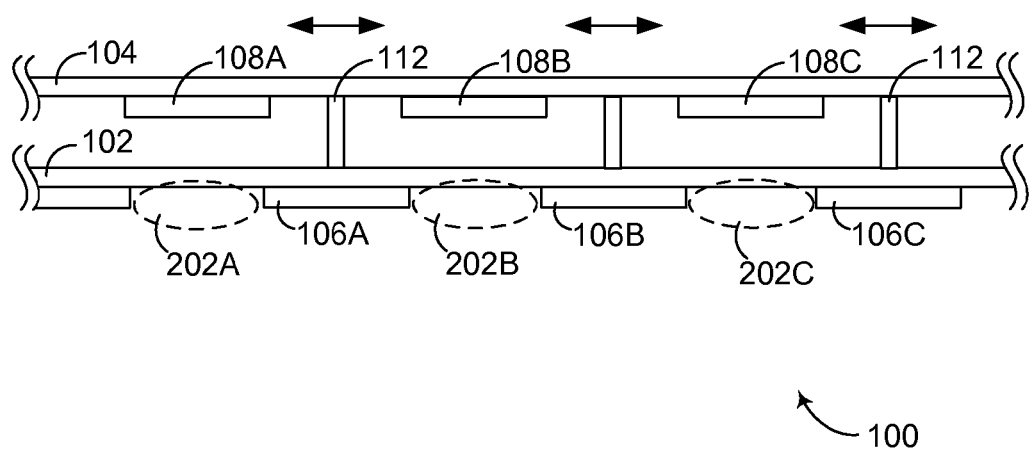
FIG. 2 is a cross sectional view illustrating an exemplary transducer apparatus in stretched state, according to one embodiment.
Figure 3:
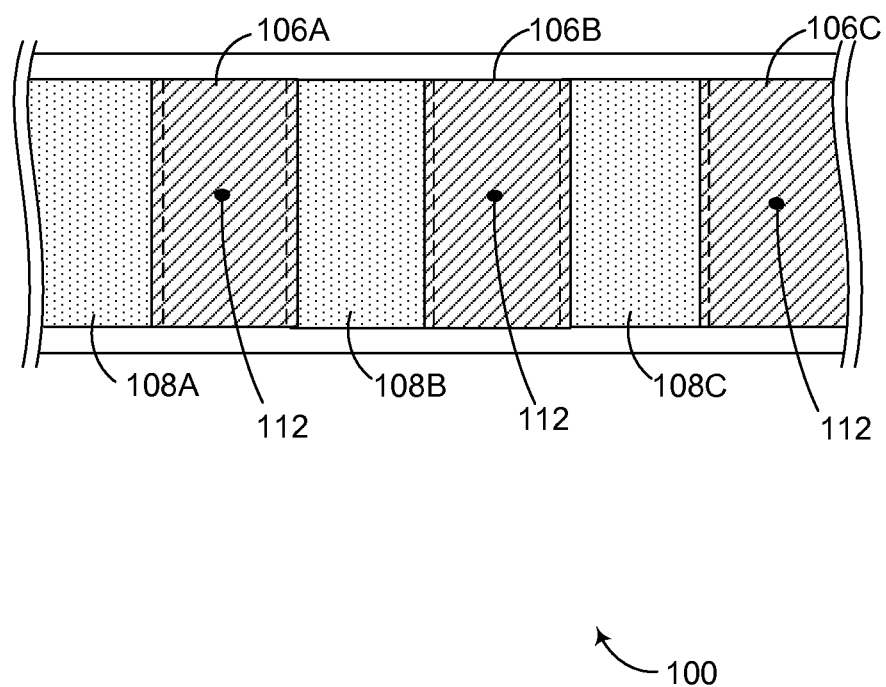
FIG. 3 is a bottom view of the exemplary transducer apparatus in the stretched state, according to one embodiment.

Also, the first transducer modules 106 and the second transducer modules 108 are mounted relative to each other such that the second transducer modules 108 substantially cover dead zones of the first transducer modules 106 when the first elastomeric substrate 102 and the second elastomeric substrate 104 are stretched. For example, as the transducer apparatus 100 is stretched, areas of dead zones due to the first transducer modules 106 may be created or areas of existing dead zones are increased. Positioning of the second transducer modules 108 are such that dead zones of the first transducer modules 106 are substantially covered when the transducer apparatus 100 is stretched. A cross section view of the transducer apparatus 100 in a stretched state is illustrated in FIG. 2. FIG. 2 also illustrates positions of the second transducer modules 108 relative to the first transducer modules 106, and dead zones 202, such as dead zones 202A-C. A bottom view illustrating the positioning of the second transducer modules 108 relative to the first transducer modules 106 is illustrated in FIG. 3.

Figure 4:
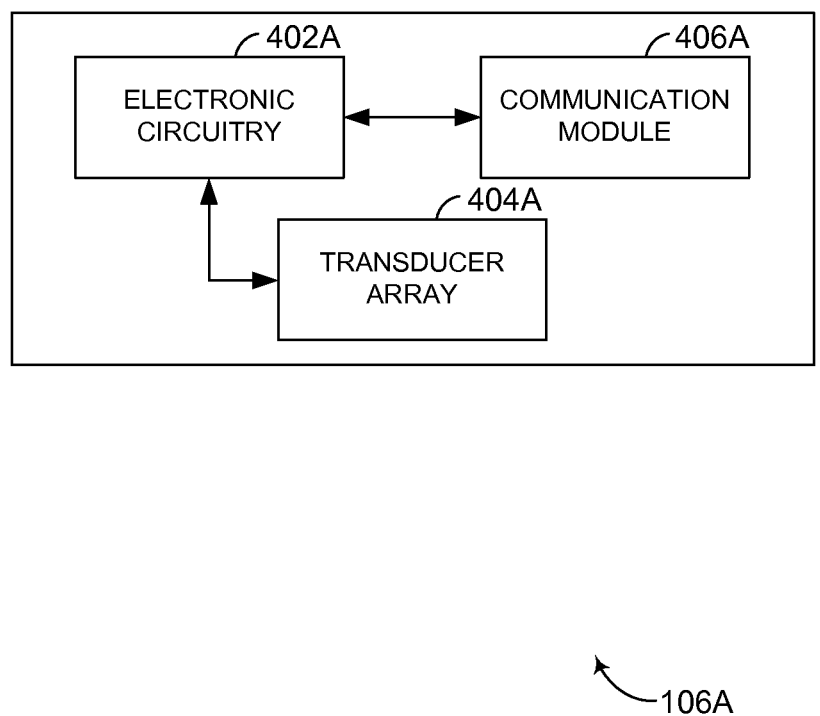
FIG. 4 is a logical view of a transducer module, according to one embodiment.

Each transducer module of the first transducer modules 106 and the second transducer modules 108 may comprise a transducer array, an electronic circuitry, and a communication module. In one example implementation, the transducer array may be mounted on the electronic circuitry and the communication module within the transducer module. The transducer array may comprise multiple transducers. The electronic circuitry may be coupled to the transducer array. The electronic circuitry may provide control signals to the transducer array to generate a transmission signal. The electronic circuitry may also convert signals sensed by the transducer array into a form useful for processing. Additionally, the electronic circuitry may compute positional and orientation details relative to at least one other transducer module of the first transducer modules 106 and the second transducer modules 108. The electronic circuitry may comprise one or more of, an analog to digital (A/D) circuit, a digital to analog (D/A) circuit, a buffering circuit, a signal summation circuit, a signal processing circuit, interface circuits, photonics and other circuits to control the transducers array and/or to convert signals generated by transducer array. In one embodiment, the electronic circuitry may be an application specific integrated circuit (ASIC) in which one or more of circuits may be implemented. In another embodiment, the electronic circuitry may be one or more discretely coupled circuits. The communication module enables communication with at least one other transducer module and/or a central processing unit. FIG. 4 illustrates the exemplary transducer module 106A that comprises an electronic circuitry 402A, a transducer array 404A and a communication module 406A.

At least one transducer module of the first transducer modules 106 and the second transducer modules 108 may communicate sensed signals, and positional and orientation details processed by respective electronic circuitry to at least one of the central processing units and/or to at least one other transducer module of the first transducer modules 106 and the second transducer modules 108. Also, at least one transducer module of the first transducer modules 106 and the second transducer modules 108 may receive the control signal from the central processing unit directly or through network of transducers.

In one embodiment, the transducer modules may communicate via free space, such as using optical signals, ultrasonic signals, electromagnetic signal, and radio frequency (RF) signals, among others. In another embodiment, the transducer modules may communicate through signal traces deposited on corresponding elastomeric substrate. The signal traces may be a routing layer comprised of flexible polyamide circuit or an organic circuit. In another embodiment, the transducer modules may communicate via flexible wires (which may be in the plane of or outside the plane of the elastomeric substrates), multi-wire cables, metal fibers woven in the elastomeric substrates, or additional flexible polyamide circuits. In another embodiment, the transducer modules may communicate using any combination of above methods. Other methods of communication between the transducer modules are also contemplated herein.

The central processing unit may be a computing device or circuitry or hardware that communicates the control signals to each transducer module of the first transducer modules 106 and the second transducer modules 108. The central processing unit may communicate the control signals through a free space or through wired medium. The central processing unit may also receive signals from at least one transducer module of the first transducer modules 106 and the second transducer modules 108. The central processing unit may further process the received signals to generate an observation data. The central processing unit may store the observation data in a recording and/or storage medium(s). The central processing unit may further process the observation data, for example to generate visual data for displaying images on a display device (not shown).

Additionally, the central processing unit may process the position and/or orientation details of at least one transducer module of the first transducer modules 106 and the second transducer modules 108 to determine a relative (or an absolute) position and/or a relative (or an absolute) orientation of at least one transducer module to at least one other transducer module and/or to a central coordinate system, hereinafter collectively referred to as "positional details". The central processing unit may use the positional details for different purposes. According to one embodiment, the central processing unit may use the positional details to interpret signals relative (or absolute) to a location of the transducer module conformed to contour the subject being studied. For example, in medical imaging, the central processing unit may use the positional details during image reconstruction to ensure that any given signal is properly matched to the true location of origin in a subject under study. Further, using the positional details, the central processing unit may reconfigure transducer module network dynamically to optimize or provide substantial transducer coverage. For example, in ultrasonic beamforming, the central processing unit may reconfigure networking between the transducer modules in the transducer apparatus 100 to select two or more transducer modules as receivers to ensure substantial and accurate transducer receiver coverage. The central processing unit may also use the positional details to monitor shape of the transducer apparatus 100 conformed to contour of surface of study.

At least one transducer module of the first transducer modules 106 and the second transducer modules 108 may be communicatively coupled to at least one other transducer module of the first transducer modules 106 and the second transducer modules 108. In one embodiment, two or more transducer modules of the first transducer modules 106 and the second transducer modules 108 may be communicatively coupled as a network of transducers.

Also, each transducer module of the first transducer modules 106 and the second transducer modules 108 may be communicatively coupled to a central processing unit directly and/or through the network of transducers. In one embodiment, each transducer module of the first transducer modules 106 and the second transducer modules 108 may be communicatively coupled to the central processing unit through a daisy chain network. In another embodiment, each transducer module of the first transducer modules 106 and the second transducer modules 108 may be star-coupled to the central processing unit. In another embodiment, the first transducer modules 106 may form a daisy chain network and the second transducer modules 108 may form a star network. Other embodiments where the transducer modules 106 and 108 may be coupled to the central processing unit through the network of transducers are contemplated herein.

Figure 5:
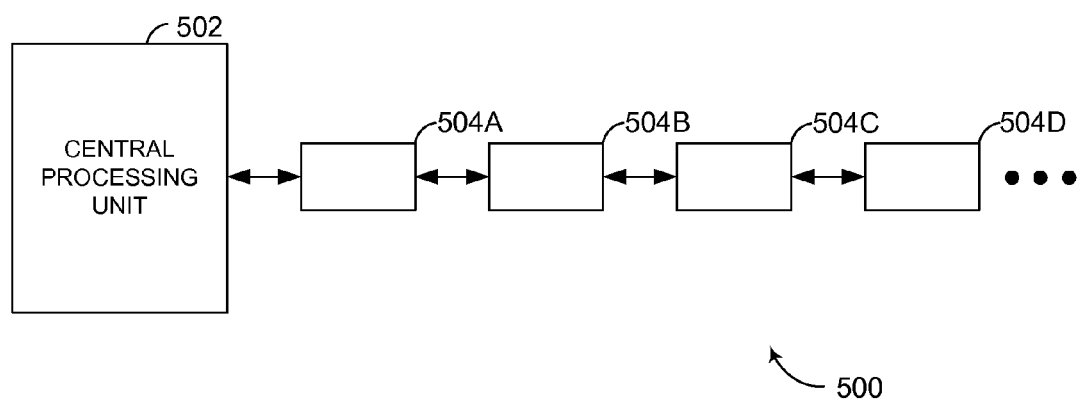
FIG. 5 is a system view illustrating transducer modules communicatively coupled to a central processing unit in a daisy chain network, according to one embodiment.

FIG. 5 illustrates an example configuration 500 where transducer modules 504A-D are communicatively coupled to a central processing unit 502 via a daisy chain network. The transducer module 504B is coupled to the central processing unit 502 through the transducer module 504A. Similarly, the transducer module 504C is coupled to the central processing unit 502 via a daisy chain of the transducer modules 504B and 504A. Furthermore, the transducer module 504D is coupled to the central processing unit 502 via a daisy chain of the transducer modules 504C, 504B and 504A. The transducer modules 504A-D may be, at least a subset of the transducer modules mounted on one elastomeric substrate or at least a subset of the transducer modules mounted on more than one elastomeric substrate.

Figure 6:
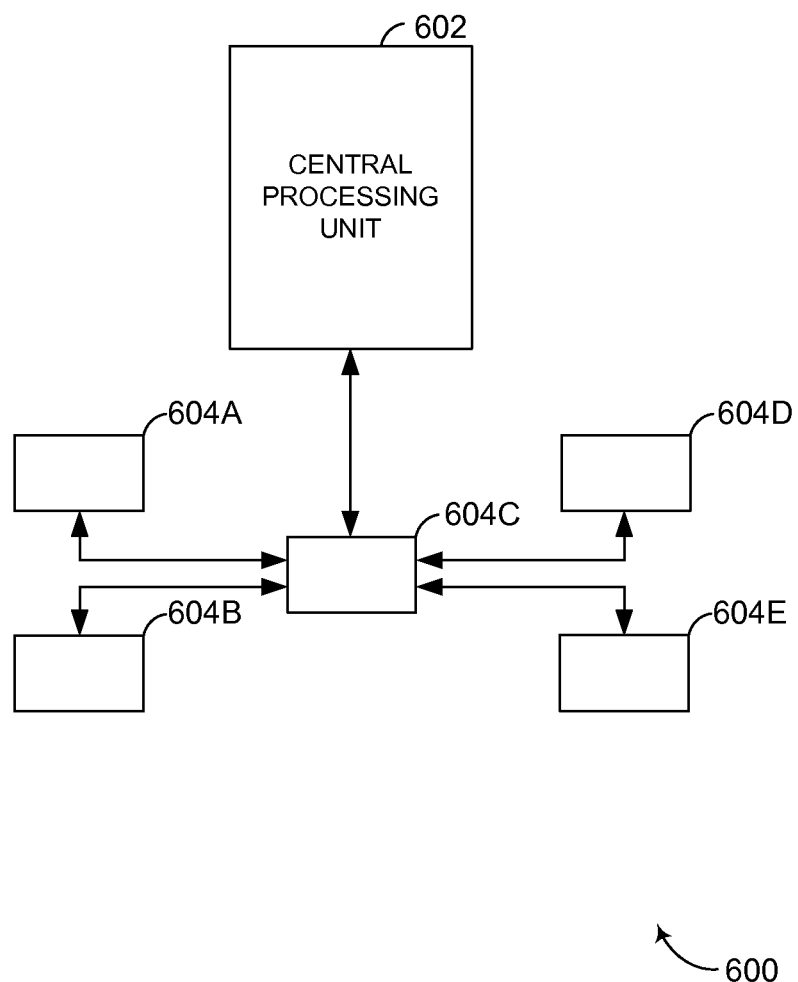
FIG. 6 is a system view illustrating the transducer modules communicatively coupled to the central processing unit in a star network, according to one embodiment.

FIG. 6 illustrates an example configuration 600 where transducer modules 604A-E are communicatively coupled to a central processing unit 602 via a star network. The transducer modules 604A, 604B, 604D, and 604E are star coupled to the central processing unit 602 through the transducer module 604C. The transducer module 604C is directly coupled to the central processing unit 602 and configured as a hub for the transducer modules 604A, 604B, 604D, and 604E. The transducer modules 604A-E may be, at least a subset of the transducer modules mounted on one elastomeric substrate or at least a subset of transducer modules mounted on more than one elastomeric substrate.

Figure 7:
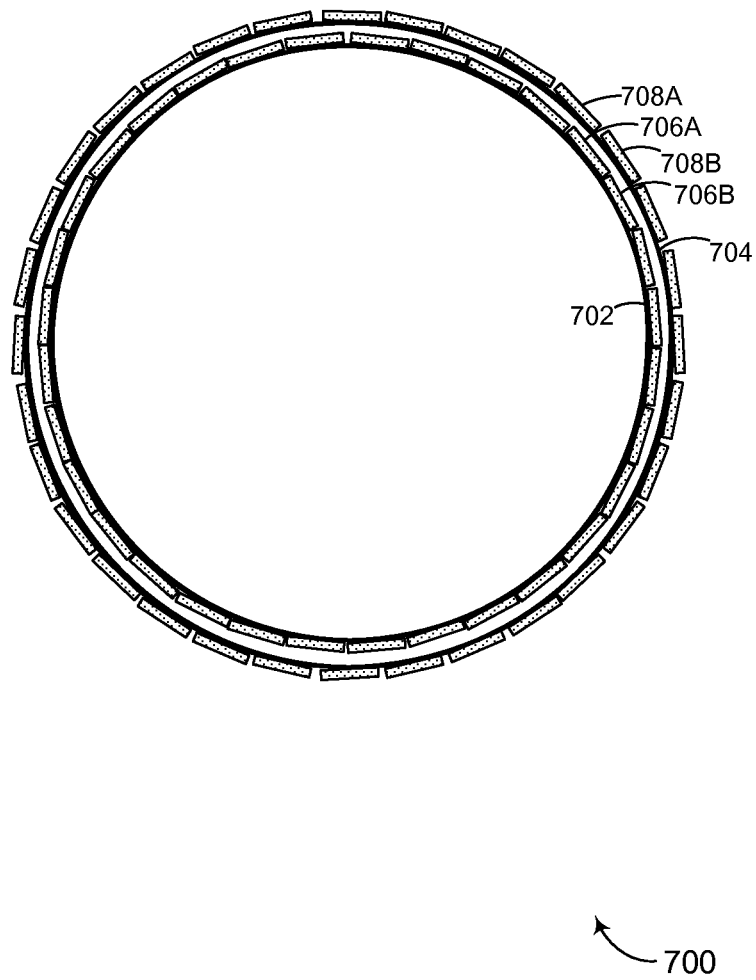
FIG. 7 is a side view of an exemplary band-shaped transducer apparatus, according to one embodiment.
Figure 8:
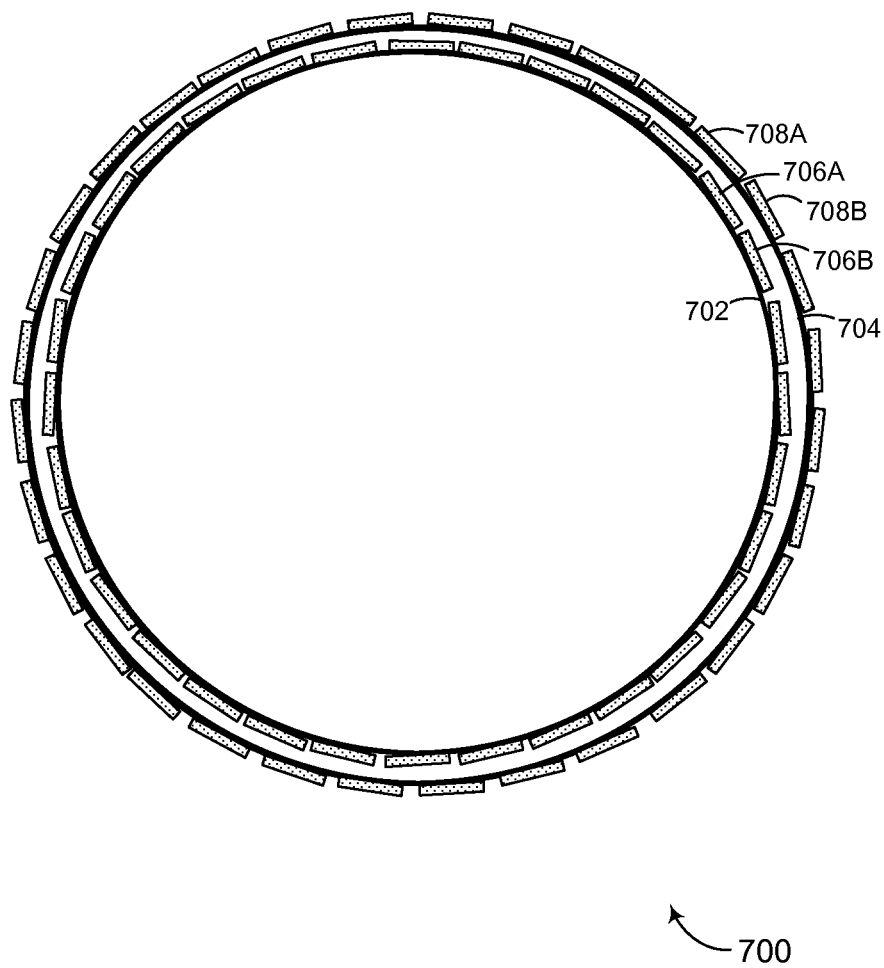
FIG. 8 is a side view of the exemplary band-shaped transducer apparatus in the stretched state, according to one embodiment.

The transducer apparatus 100 may be used as a strip that can be conformed to surface of study. In one example, the transducer apparatus 100 may be laid and conformed on geometrical contour of an object such as a pipe. In another example, the transducer apparatus 100 may be laid and conformed on non-geometrical contour of body surfaces, such as, throat, nose, and breast. In another example embodiment, the transducer apparatus 100 may be used as a band. An exemplary band shaped transducer apparatus 700 is illustrated in FIG. 7. Band shaped transducer apparatus 700 comprise a transducer modules 706, such as transducer module 706A, and transducer module 706B, mounted on an elastomeric substrate 702. The band shaped transducer apparatus 700 also comprises a transducer modules 708, such as a transducer module 708A, and a transducer module 708B, mounted on another elastomeric substrate 704. Due to elasticity of elastomeric substrates, the band shaped transducer apparatus 700 may be used for testing of objects of various sizes. In one example, the band shaped transducer apparatus 700 may be used in non-destructive testing of pipes of different sizes and/or for a pipe having varying diameter. In another example, the band shaped transducer apparatus 700 may be used in medical imaging, for example, in testing of arms, legs or other body parts of different sizes. FIG. 8 illustrates the band shaped transducer apparatus 700 in a stretched state. The band shaped transducer apparatus may be formed by coupling two ends of strip-shaped transducer apparatus using permanent locks or temporary fasteners, such as, latch and release clasps, and hook and loop fasteners.

According to one embodiment, the transducer apparatuses comprise transducer modules mounted in one row on each elastomeric substrate. In another embodiment, a transducer apparatus may be designed with a plurality of transducer modules mounted in more than one row on each elastomeric substrate. Furthermore, in another embodiment, a transducer apparatus may be designed with more than two elastomeric substrates having a single row of transducer modules or multiple rows of transducer modules.

Figure 9:
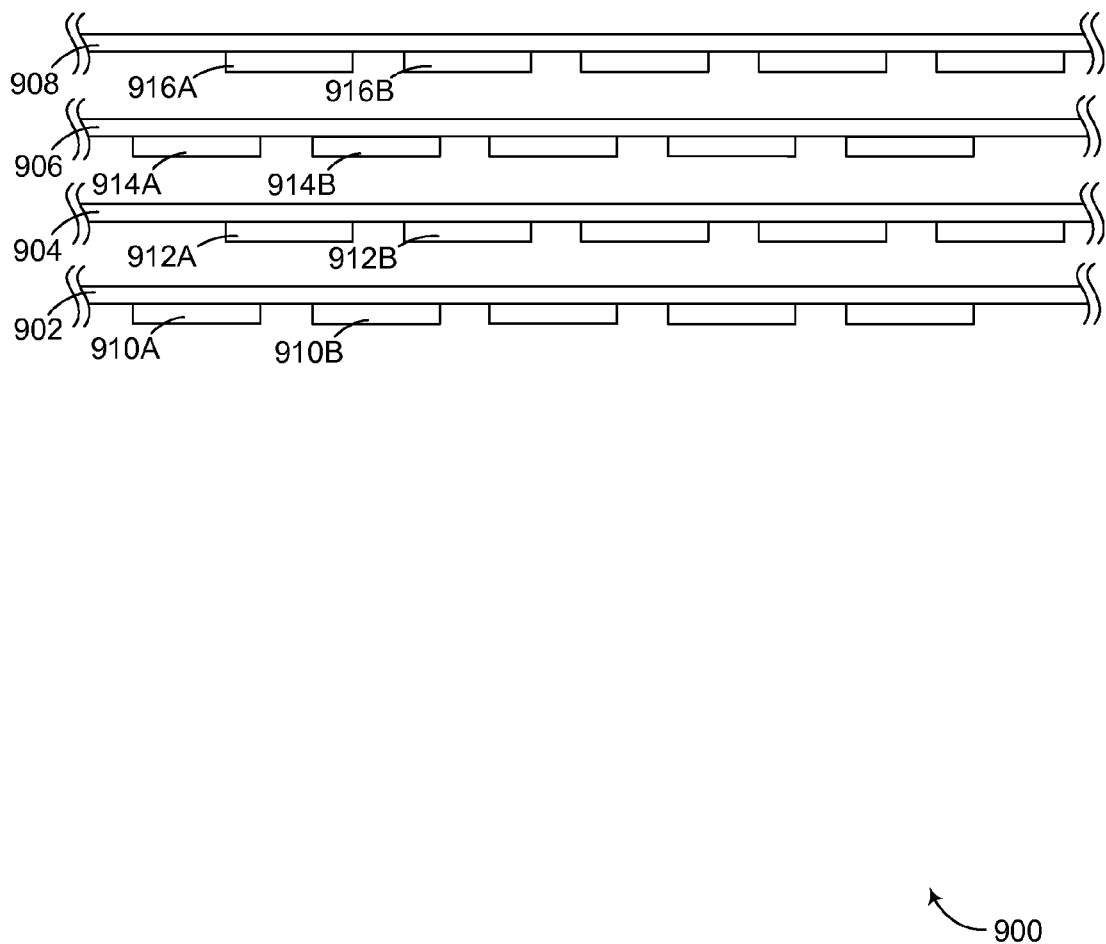
FIG. 9 is a cross sectional view of an exemplary transducer apparatus with multiple elastomeric substrates, according to one embodiment.

A side view of an exemplary transducer apparatus 900 having four (4) transducer substrates is illustrated in FIG. 9. Transducer apparatus 900 comprises a first elastomeric substrate 902, a second elastomeric substrate 904, a third elastomeric substrate 906, and a fourth elastomeric substrate 908. A plurality of first transducer modules 910, such as a transducer module 910A, and a transducer module 910B, are mounted on the first elastomeric substrate 902. A plurality of second transducer modules 912, such as a transducer module 912A, and a transducer module 912B, are mounted on the second elastomeric substrate 904. a plurality of third transducer modules 914, such as a transducer module 914A, and a transducer module 914B, are mounted on the third elastomeric substrate 906. A plurality of fourth transducer modules 916, such as a transducer module 916A, and a transducer module 916B, are mounted on the fourth elastomeric substrate 908.

The first transducer modules 910, the second transducer modules 912, the third transducer modules 914, and the fourth transducer modules 916 are mounted relative to each other such that the second transducer modules 912, the third transducer modules 914, and the fourth transducer modules 916 substantially cover dead zones of the first transducer modules 910 when the transducer apparatus 900 is in a normal state and/or in a stretched state. According to one example, the second transducer modules 912 substantially covers dead zones between the individual transducer modules 910 arranged in one row. For example, the transducer module 912A covers dead zones between the individual transducer modules 910A and 910B arranged in row. Similarly, the third transducer modules 914 may substantially cover dead zones between the individual adjacent transducer modules 910 in another row (not shown). Further, the fourth transducer modules 916 may substantially cover dead zones of the first transducer modules 910 which are not covered by the second transducer modules 912 and the third transducer modules 914.

Figure 10:
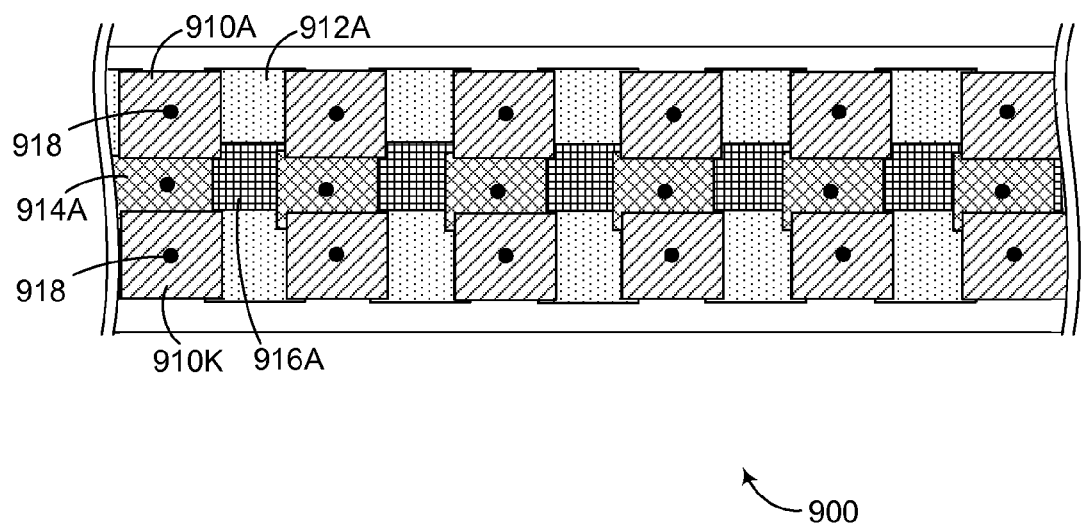
FIG. 10 is a bottom view of the exemplary transducer apparatus with multiple elastomeric substrates, according to one embodiment.

FIG. 10 is a bottom view of the transducer apparatus 900 illustrating positioning of the first transducer modules 910, the second transducer modules 912, the third transducer modules 914, and the fourth transducer modules 916, in one embodiment. According to one example, the first transducer modules 910, the second transducer modules 912, the third transducer modules 914, and the fourth transducer modules 916 may be mounted in multiple rows to effectively cover dead zones when the transducer apparatus 900 is expanded in multiple directions. Elastomeric layers may be coupled to each other using rivets 918.

The transducer apparatus 900 may take a shape of a patch, a sheet, or a blanket. The transducer apparatus 900 may be used for observations on larger surfaces. Similar to the transducer apparatus 100, the transducer apparatus 900 may conform to surfaces with irregular geometry. Examples of such surfaces on a human subject include, but are not limited to, abdomen, breast, face, throat, and neck. Transducer apparatus may also take a form of looped sheet, cylinder, sphere, or any other form, upon such constructions for specific applications.

The performance of the transducer apparatuses may be improved by various methods. For example, a coupling medium may be provided between the elastomeric substrates to avoid signal reflections. For example, in case of ultrasound measurement, a coupling medium, such as oil, water, silicone, or any other suitable material, may be filled in the space between the elastomeric substrates to avoid acoustic reflection at interfaces. Further, an insulation coating may be applied on the transducer modules to provide electrical insulation.

Further, the size of transducer modules may be chosen based on the geometry of the surface under test. In one embodiment, small-sized transducer modules may be used when the capability of conforming to complex 3D structures having high geometric irregularities is desired. In another embodiment, larger sized transducer modules may be chosen in applications where the target surface has less geometric irregularities. In some embodiments, transducer modules may be physically flexible. Physical flexibility of the transducer modules may be achieved by making respective transducer arrays and corresponding electronic circuitry sufficiently thin. Also, the transducer modules may be composed of a laminated stack with an intervening interposer made of a flexible material (for example, polyimide) to make the transducer modules flexible.

The present invention has been described in terms of several embodiments solely for the purpose of illustration. The invention is not limited to the embodiments described, but may be practiced with modifications and alterations limited only by the spirit and scope of the appended claims.

What is claimed is:

1. An apparatus comprising:
   an elastomeric substrate;
   a plurality of transducer modules mounted on the elastomeric substrate;
   another elastomeric substrate;
   a plurality of additional transducer modules mounted on the another elastomeric substrate; wherein each transducer module of the plurality of transducer modules and the plurality of additional transducer modules comprising:
   a transducer array having multiple transducer elements; and
   electronic circuitry coupled to the transducer array; and wherein the plurality of transducer modules and the plurality of additional transducer modules are mounted relative to each other whereby the plurality of additional transducer modules substantially cover any dead zones of the plurality of transducer modules.

2. The apparatus of claim 1, wherein the plurality of transducer modules and the plurality of additional transducer modules are mounted relative to each other whereby the plurality of additional transducer modules substantially cover the dead zones of the plurality of transducer modules when the elastomeric substrate and the other elastomeric substrate are stretched.

3. The apparatus of claim 1, wherein an individual transducer module is electrically coupled with at least one other transducer module.

4. The apparatus of claim 1, wherein the transducer module further comprises a communication module to communicate with at least one of a central processing unit and at least one other transducer module.

5. The apparatus of claim 1, wherein the transducers elements comprise at least one of an optical transducer, a thermal transducer, an ultrasonic transducer, an impedance transducer, a leakage current transducer, an electromagnetic transducer, an X-ray transducer, and a radio frequency (RF) signal transducer.

6. The apparatus of claim 1, wherein the plurality of transducer modules and the plurality of additional transducer modules are flexible.

7. The apparatus of claim 1, wherein the plurality of transducer modules and the plurality of additional transducer modules form a network.

8. The apparatus of claim 1, wherein each of the plurality of transducer modules and the plurality of additional transducer modules are configured to determine at least one of a relative position and a relative orientation between individual transducer modules.

9. The apparatus of claim 1, wherein the plurality of transducer modules and the plurality of additional transducer modules each are configured to determine at least one of a position and an orientation relative to an external reference.

10. The apparatus of claim 1, wherein the elastomeric substrate and the other elastomeric substrate comprise at least one of a nylon, a wool, a neoprene, a cotton, and a polyimide material.

11. The apparatus of claim 1, wherein the plurality of transducer modules and the plurality of additional transducer modules are mounted in at least one row on the elastomeric substrate and the other elastomeric substrate respectively.

12. The apparatus of claim 1, wherein the apparatus is at least one of an elastic looped band, a conformal flexible patch, and a conformal flexible sheet.

13. The apparatus of claim 1, wherein the transducer module communicates with at least one other transducer module via one or more of: signal traces deposited on the elastomeric substrate and the other elastomeric substrate, metal fibers woven into the elastomeric substrate and the other elastomeric substrates, flexible wires, multi-wire cables, flexible polyamide circuits, free-space optical communication, free-space electromagnetic communication, free-space ultrasonic communication and free-space radio frequency communication.

14. The apparatus of claim 1 further comprising a coupling medium disposed between the elastomeric substrate and the other elastomeric substrate.

15. The apparatus of claim 1 further comprising coupling means for coupling the elastomeric substrate to the other elastomeric substrate.

16. The apparatus of claim 1, wherein the plurality of the transducer modules and the plurality of additional transducer modules are covered using insulation coating material, wherein the insulation coating material comprises one of a silicone, polydimethylsiloxane (PDMS), and transparent epoxy.

17. The apparatus of claim 1, wherein at least one side of the elastomeric substrate and the other elastomeric substrate are coated using signal absorbing materials, wherein the absorbing materials comprise one of an acoustic absorber, and an x-ray absorber.

18. The apparatus of claim 1, wherein the plurality of transducer modules and the plurality of additional transducer modules are mounted on the elastomeric substrate, and the other elastomeric substrate, respectively, using an attaching material, wherein the attaching material comprises at least one of epoxy, and glue.

19. A system comprising:
a transducer apparatus, the transducer apparatus comprising:
an elastomeric substrate;
a plurality of transducer modules mounted on the elastomeric substrate;
another elastomeric substrate coupled to the elastomeric substrate;
a plurality of additional transducer modules mounted on the another elastomeric substrate, wherein each of the plurality of transducer modules and the plurality of additional transducer modules comprising:
a transducer array having multiple transducer elements; and
electronic circuitry coupled to the transducer array;
wherein the plurality of transducer modules and the plurality of additional transducer modules are mounted relative to each other whereby the plurality of additional transducer modules substantially cover any dead zones of the plurality of transducer modules; and
a central processing unit communicatively coupled to at least one transducer module of the plurality of transducer modules and the plurality of additional transducer modules.

20. The system of claim 19, wherein the plurality of transducer modules and the plurality of additional transducer modules are mounted relative to each other whereby the plurality of additional transducer modules substantially cover the dead zones of the plurality of transducer modules when the elastomeric substrate and the other elastomeric substrate are stretched.

21. The system of claim 19, wherein the central processing unit is configured to monitor at least one of a relative orientation and a relative position of each transducer module.

22. The system of claim 19, further comprising at least one hub to couple the at least one transducer module of the plurality of transducer modules and the plurality of the additional transducer modules to the central processing unit.

23. The system of claim 19, wherein the transducer elements are at least one of an optical transducer, a thermal transducer, an ultrasonic transducer, an impedance transducer, a leakage current transducer, an electromagnetic transducer, an X-ray transducer, and a radio frequency (RF) signal transducer.

24. The system of claim 19, wherein the plurality of transducer modules and the plurality of additional transducer modules form a network.

25. The system of claim 19, wherein the elastomeric substrate and the other elastomeric substrate comprises at least one of a nylon, a wool, a neoprene, a cotton, and a polyimide material.

26. The system of claim 19, wherein the plurality of transducer modules and the plurality of additional transducer modules are flexible.

* * * * *